(12) United States Patent
Yoshida et al.

(10) Patent No.: US 11,232,551 B2
(45) Date of Patent: Jan. 25, 2022

(54) WAFER INSPECTING APPARATUS

(71) Applicant: DISCO CORPORATION, Tokyo (JP)

(72) Inventors: Shinji Yoshida, Tokyo (JP); Koji Hashimoto, Tokyo (JP); Yasukuni Nomura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/919,369

(22) Filed: Jul. 2, 2020

(65) Prior Publication Data

US 2021/0012482 A1 Jan. 14, 2021

(30) Foreign Application Priority Data

Jul. 10, 2019 (JP) .............................. JP2019-128524

(51) Int. Cl.
*G06T 7/00* (2017.01)
*G01N 21/95* (2006.01)
*H01L 21/66* (2006.01)
*H01L 21/687* (2006.01)

(52) U.S. Cl.
CPC ....... *G06T 7/0004* (2013.01); *G01N 21/9501* (2013.01); *H01L 21/68714* (2013.01); *H01L 22/12* (2013.01); *G06T 2207/30148* (2013.01)

(58) Field of Classification Search
CPC ......... G06T 7/0004; G06T 2207/30148; G06T 2207/20056; G01N 21/9501; H01L 22/12; H01L 22/20; H01L 21/68714; B24B 37/013; B24B 49/12
USPC ...................... 356/237.1–237.5; 382/141–151
See application file for complete search history.

(56) References Cited

U.S. PATENT DOCUMENTS

| | | | |
|---|---|---|---|
| 9,616,544 B2 * | 4/2017 | Ito | G06T 7/0004 |
| 2009/0085594 A1 * | 4/2009 | Yamamoto | G01R 31/2891 324/762.05 |
| 2015/0017782 A1 * | 1/2015 | Akiyama | H01L 21/681 438/455 |
| 2015/0192529 A1 * | 7/2015 | Sato | G01N 21/88 438/16 |
| 2016/0059375 A1 | 3/2016 | Ito et al. | |
| 2017/0338158 A1 | 11/2017 | Sukegawa et al. | |

FOREIGN PATENT DOCUMENTS

| | | |
|---|---|---|
| JP | 2016049581 A | 4/2016 |
| JP | 2016075554 A | 5/2016 |
| JP | 2017116293 A | 6/2017 |

* cited by examiner

*Primary Examiner* — Hoa Q Pham
(74) *Attorney, Agent, or Firm* — Greer, Burns & Crain, Ltd.

(57) ABSTRACT

A micro camera is placed in an appropriate image capturing position therefor on the basis of a center-to-center distance depending on a rotational angle of a holding table. Even in the case where the center C0 of a holding surface and the center C1 of a wafer are displaced out of alignment with each other, allowing a position in X-axis directions of an outer circumference of the wafer to vary as the holding table rotates, a control unit can make an image capturing range of the micro camera follow the varying position of the outer circumference of the wafer. Therefore, the image capturing range of the micro camera can be determined with ease. Both a surface of the wafer and the outer circumference of the wafer can be inspected simply when two cameras are moved along the X-axis directions by a single X-axis moving mechanism.

1 Claim, 3 Drawing Sheets

WAFER INSPECTING APPARATUS

BACKGROUND OF THE INVENTION

Field of the Invention

The present invention relates to a wafer inspecting apparatus.

Description of the Related Art

It has been customary in the art to capture an image of a surface of a wafer that has been ground by grinding stones and inspect the state of the ground surface of the wafer on the basis of the captured image (see JP 2016-049581A and JP 2016-075554A). There is also a technology for capturing an image of the edge of a wafer with an image capturing unit and inspecting the edge of the wafer to ascertain whether or not the edge has chipped on the basis of the captured image.

For inspecting the ground surface of a wafer, an image capturing camera having a wide field of vision, i.e., a wide image capturing range, or a macro camera, is used in order to shorten the time required to inspect the ground surface. For inspecting the edge of a wafer, on the other hand, an image capturing camera having a narrow field of vision, i.e., a narrow image capturing range, or a micro camera, is used in order to measure the size of a chip on the edge of the wafer. In other words, an image in the narrow image capturing range is captured with a high pixel count for increased measurement accuracy. Two cameras, i.e., a macro camera and a micro camera, are thus used to capture images of both the ground surface and the edge of a wafer.

SUMMARY OF THE INVENTION

In the case where a macro camera and a micro camera are used, these two cameras capture images of different areas, i.e., the surface and the edge of a wafer that are different from each other. If the cameras are combined with respective moving means for moving the cameras to the respective areas whose images are to be captured by the cameras, then an inspecting apparatus incorporating these cameras tends to large in size.

It is therefore an object of the present invention to provide a wafer inspecting apparatus that is capable of moving a macro camera and a micro camera to respective areas of a wafer whose images are to be captured by the cameras, with minimum moving means, for inspecting the ground surface and the edge of the wafer on the basis of the captured images.

In accordance with an aspect of the present invention, there is provided a wafer inspecting apparatus for capturing images of a surface and an outer circumference of a wafer and inspecting the surface and the outer circumference of the wafer on the basis of the captured images, including a macro camera for capturing images of the surface of the wafer, a micro camera for capturing an image of the outer circumference of the wafer, the micro camera having a narrower image capturing range and a higher magnification ratio than the macro camera, a holding table having a holding surface for holding the wafer thereon, an electric motor for rotating the holding table about an axis at the center of the holding surface, an angle recognizer for recognizing a rotational angle of the holding table that is rotated by the electric motor, a support supporting the macro camera and the micro camera thereon, an X-axis moving mechanism for moving the support in X-axis directions parallel to the holding surface, and a control unit. The control unit includes a center calculating section for moving the macro camera to a position capable of capturing the image of the outer circumference of the wafer, recognizing coordinates of at least three points on the outer circumference of the wafer from the images captured by the macro camera, and calculating center coordinates of the wafer on the basis of the coordinates of the three points, and a distance calculating section for acquiring a relation between a center-to-center distance in the X-axis directions between center coordinates of the holding surface that are recognized beforehand and the center coordinates of the wafer calculated by the center calculating section, and the rotational angle of the holding table, rotating the holding table, and calculating the center-to-center distance depending on the rotational angle of the holding table that is recognized by the angle recognizer. The control unit controls the X-axis moving mechanism to move the micro camera along the X-axis directions on the basis of the distance in the X-axis directions between a center of the image capturing range of the micro camera and the center of the holding surface, and the center-to-center distance calculated by the distance calculating section and to place the micro camera in an image capturing position in the X-axis directions for placing the image capturing range of the micro camera over the outer circumference of the wafer. The control unit controls the micro camera to capture the image of the outer circumference of the wafer and inspect the state of the outer circumference of the wafer on the basis of the captured image.

According to the present invention, even in the case where the center coordinates of the holding surface and the center coordinates of the wafer are displaced out of alignment with each other, allowing the position in the X-axis directions of the outer circumference of the wafer to vary as the holding table rotates, the control unit can make the image capturing range of the micro camera follow the varying position of the outer circumference of the wafer. Therefore, the image capturing range of the micro camera can be determined with ease even if the center coordinates of the holding surface and the center coordinates of the wafer are displaced out of alignment with each other.

Furthermore, images of both the surface of the wafer and the outer circumference of the wafer can be captured and both the surface of the wafer and the outer circumference of the wafer can be inspected simply when the macro camera and the micro camera are moved along the X-axis directions by the single X-axis moving mechanism. The wafer inspecting apparatus can thus easily be rendered compact.

The above and other objects, features and advantages of the present invention and the manner of realizing them will become more apparent, and the invention itself will best be understood from a study of the following description and an appended claim with reference to the attached drawings showing a preferred embodiment of the invention.

DETAILED DESCRIPTION OF THE PREFERRED EMBODIMENT

Figure 1:
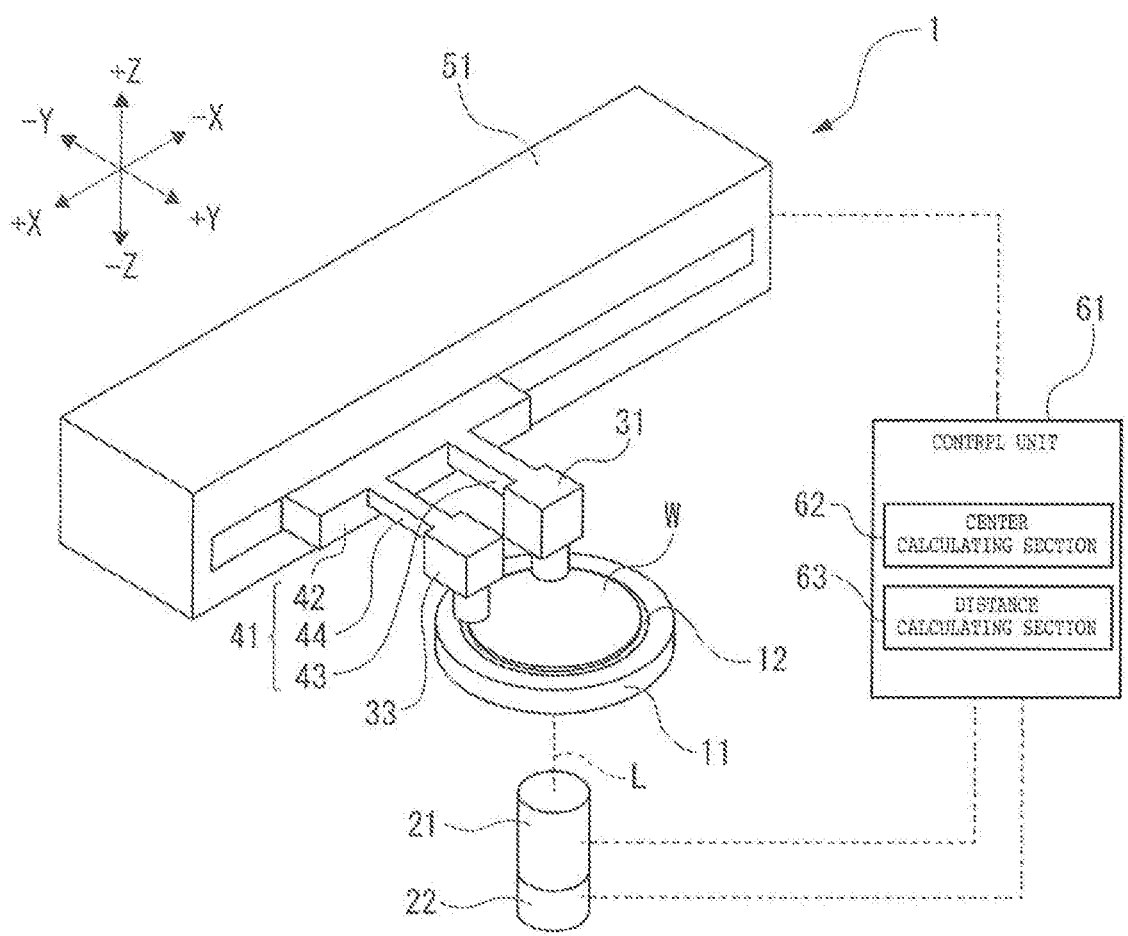
FIG. 1 is a perspective view, partly in block form, of a wafer inspecting apparatus according to an embodiment of the present invention.

A wafer inspecting apparatus 1 according to a preferred embodiment of the present invention illustrated in FIG. 1 is an apparatus for capturing images of a surface and an outer circumference of a wafer W and inspecting the surface and the outer circumference of the wafer W on the basis of the captured images. Particularly, the wafer inspecting apparatus 1 captures images of a ground surface and an outer circumference of the wafer W and inspecting the ground surface and the outer circumference of the wafer W on the basis of the captured images.

As illustrated in FIG. 1, the wafer inspecting apparatus 1 includes a holding table 11 for holding the wafer W thereon, an electric motor 21 for rotating the holding table 11, and an encoder 22. The holding table 11 has a holding surface 12 for holding the wafer W thereon. The holding surface 12 includes, for example, a porous ceramic material and is selectively held in fluid communication with a suction source, not illustrated, for attracting and holding the wafer W under suction thereon.

The electric motor 21 rotates the holding table 11 about a central axis L extending vertically in Z-axis directions through the center of the holding surface 12 of the holding table 11. The encoder 22 has a function to recognize rotational angles of the holding table 11 rotated by the electric motor 21 and exemplifies an angle recognizer.

The wafer inspecting apparatus 1 also includes a macro camera 31, a micro camera 33, a support 41 that supports the macro camera 31 and the micro camera 33, and an X-axis moving mechanism 51 for moving the support 41 horizontally in X-axis directions perpendicular to the Z-axis directions.

The support 41 includes a support body 42 and a first support arm 43 and a second support arm 44 that extend horizontally in Y-axis directions from the support body 42. The Y-axis directions extend perpendicularly to the Z-axis directions and the X-axis directions and include a −Y direction and a +Y direction. The first support arm 43 and the second support arm 44 extend in the +Y direction from a side surface of the support body 42 which faces in the +Y direction. The first support arm 43 supports the macro camera 31 on its distal end, whereas the second support arm 44 supports the micro camera 33 on its distal end.

The support body 42 is disposed such that it has a portion positioned in the X-axis moving mechanism 51. The X-axis moving mechanism 51 includes a built-in drive mechanism, not illustrated, that moves the support 41 including the support body 42, together with the macro camera 31 and the micro camera 33, along the X-axis directions. For example, the X-axis moving mechanism 51 moves the macro camera 31 and the micro camera 33 along the X-axis directions so as to pass over the center of the holding surface 12.

The macro camera 31 has a relatively wide field of vision, i.e., a relatively wide image capturing range, and is provided to capture an image of the surface, i.e., the ground surface, of the wafer W held on the holding table 11. On the other hand, the micro camera 33 has a relatively narrow field of vision, i.e., a relatively narrow image capturing range, and is provided to capture an image of the outer circumference, i.e., the edge, of the wafer W held on the holding table 11.

For example, the image capturing range of the macro camera 31 has a size of 15 μm×15 μm, whereas the image capturing range of the micro camera 33 has a size of 2 μm×2 μm. Furthermore, the magnification ratio of the micro camera 33 is higher than the magnification ratio of the macro camera 31.

The wafer inspecting apparatus 1 further includes a control unit 61 for controlling various components of the wafer inspecting apparatus 1. The control unit 61 has a center calculating section 62 and a distance calculating section 63, and controls the various components of the wafer inspecting apparatus 1 to enable the wafer inspecting apparatus 1 to inspect the wafer W.

Figure 2:
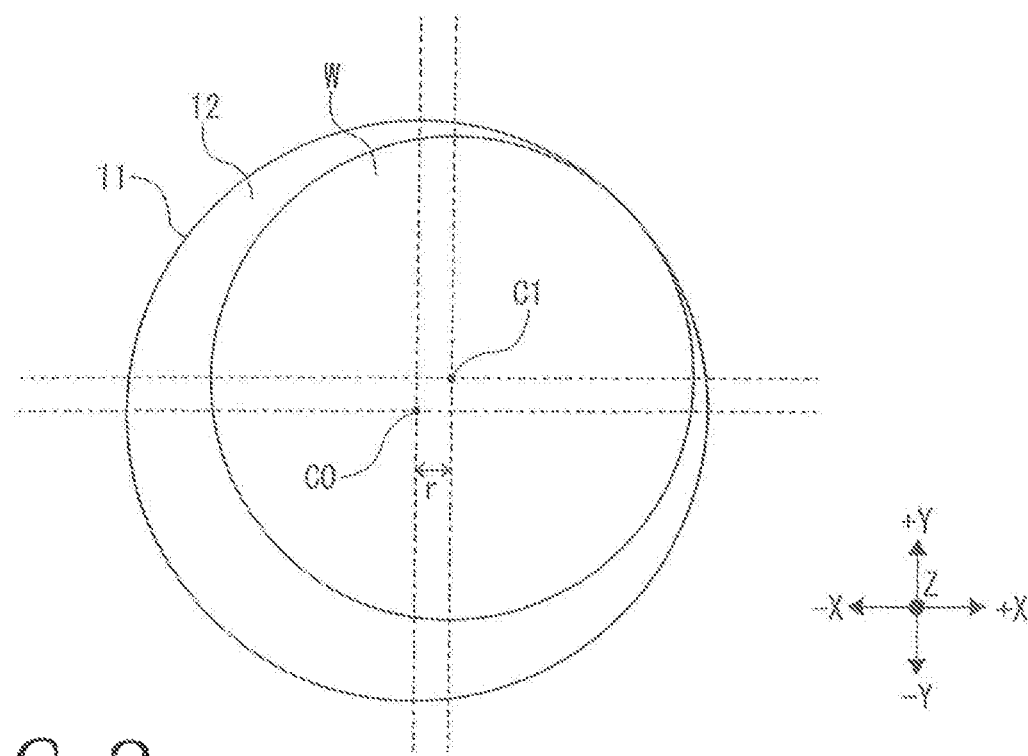
FIG. 2 is a plan view of a wafer placed on a holding surface of a holding table of the wafer inspecting apparatus.

Operation of the wafer inspecting apparatus 1 to inspect the wafer W under the control of the control unit 61 will be described below. For inspecting the wafer W, an operator or a delivery mechanism, not illustrated, places the wafer W with its ground surface facing upwardly on the holding surface 12 of the holding table 11. Thereafter, the control unit 61 brings the holding surface 12 into fluid communication with the suction source, causing the holding surface 12 to attract and hold the wafer W under suction. FIG. 2 illustrates by way of example the wafer W placed on the holding surface 12 of the holding table 11. In the example illustrated in FIG. 2, the wafer W placed on the holding surface 12 has its center C1 displaced out of alignment with the center C0 of the holding surface 12.

Next, the control unit 61 inspects the surface of the wafer W using the macro camera 31 illustrated in FIG. 1. Specifically, while controlling the X-axis moving mechanism 51 to scan the macro camera 31 over the wafer W along the X-axis directions, the control unit 61 controls the macro camera 31 to capture images of the surface, i.e., the ground surface, of the wafer W and inspects surface on the basis of the captured images.

Then, the control unit 61 inspects the state of the outer circumference of the wafer W, e.g., to ascertain whether or not the outer circumference has chipped, using the micro camera 33. In this inspection step, the center calculating section 62 of the control unit 61 first calculates the coordinates of the center C1 of the wafer W placed on the holding surface 12.

Specifically, the center calculating section 62 first controls the X-axis moving mechanism 51 to move the macro camera 31 to a position where the macro camera 31 can capture an image of the outer circumference of the wafer W. Then, the center calculating section 62 recognizes the coordinates of at least three points on outer circumference of the wafer W, i.e., outer circumference coordinates, from the image captured by the macro camera 31. Further, the center calculating section 62 calculates the coordinates of the center C1 of the wafer W, i.e., the wafer center coordinates, on the basis of the recognized outer circumference coordinates of the three points.

The center calculating section 62 may calculate the wafer center coordinates according to any known steps. For example, the center calculating section 62 creates two straight lines interconnecting adjacent two of the three points whose outer circumference coordinates have been recognized and determines perpendicular bisectors of the two straight lines. Then, the center calculating section 62 calculates the intersection of the two perpendicular bisectors as the center of the wafer W.

Next, as illustrated in FIG. 2, the distance calculating section 63 of the control unit 61 determines a center-to-center distance r as the distance along the X-axis directions between the coordinates of the center C0 of the holding surface 12, i.e., the holding surface center coordinates, that have been recognized beforehand and the wafer center coordinates calculated by the center calculating section 62.

Then, the distance calculating section 63 determines the relation between the center-to-center distance r as the distance along the X-axis directions between the holding surface center coordinates and the wafer center coordinates, and the rotational angle of the holding table 11 that is recognized by the encoder 22.

At this time, for example, the distance calculating section 63 determines the maximum value of the center-to-center distance r. Then, the distance calculating section 63 acquires the relation between the rotational angle of the holding table 11 and the center-to-center distance r in the case where the rotational angle of the holding table 11 is zero at the time the center-to-center distance r is of the maximum value.

Figure 3:
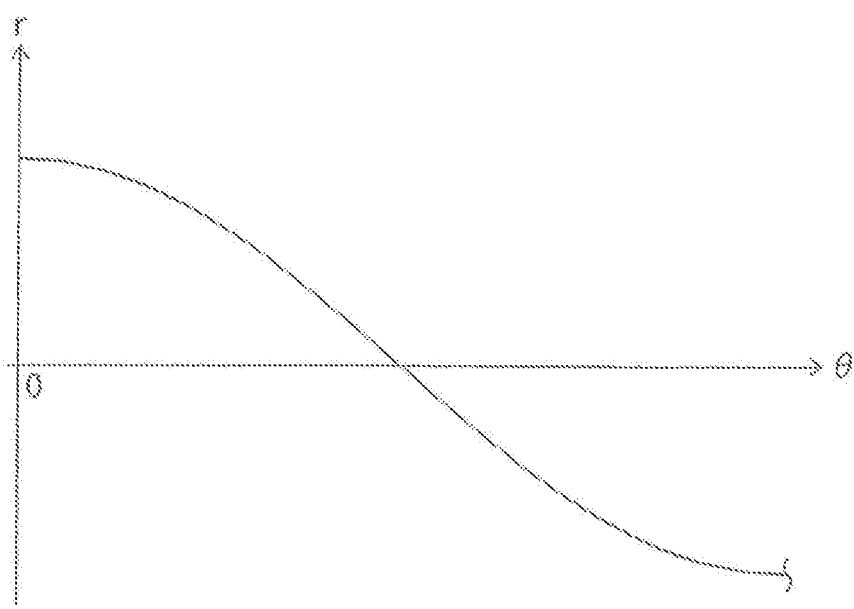
FIG. 3 is a graph illustrating by way of example a relation between the rotational angle of the holding table and a center-to-center distance.

FIG. 3 illustrates by way of example the relation between the rotational angle of the holding table 11 and the center-to-center distance r. As illustrated in FIG. 3, the center-to-center distance r varies along a cosine curve as the rotational angle θ of the holding table 11 varies. The center-to-center distance r is of a negative value when the center C1 of the wafer W at the start of the measurement step is on a side of the center C0 of the holding surface 12 in the −X direction.

Then, the distance calculating section 63 controls the electric motor 21 to rotate the holding table 11. Further, the distance calculating section 63 acquires the rotational angle of the holding table 11 that is rotating, which is recognized by the encoder 22. The distance calculating section 63 calculates the center-to-center distance r per each value of the rotational angle of the holding table 11.

The control unit 61 recognizes the distance in the X-axis directions between the center C0 of the holding surface 12 of the rotating holding table 11 and the center of the image capturing range of the micro camera 33. The control unit 61 can calculate this distance on the basis of the position of the X-axis moving mechanism 51, i.e., the position of the micro camera 33, for example.

The control unit 61 then controls the X-axis moving mechanism 51 to move the micro camera 33 along the X-axis directions on the basis of the recognized distance and the center-to-center distance r calculated by the distance calculating section 63 and to place the micro camera 33 in an image capturing position depending on the rotational angle of the holding table 11. The image capturing position refers to the position of the micro camera 33 in the X-axis directions for placing the image capturing range of the micro camera 33 over the outer circumference of the wafer W.

For example, the control unit 61 acquires an image capturing position of the micro camera 33 in the X-axis directions for placing the image capturing range of the micro camera 33 over the outer circumference of the wafer W on the basis of the calculated center-to-center distance r and the radius of the wafer W. Further, the control unit 61 calculates a distance that the micro camera 33 is to move for placing the micro camera 33 in the calculated image capturing position on the basis of the distance in the X-axis directions between the center C0 of the holding surface 12 and the center of the image capturing range of the micro camera 33. The control unit 61 controls the X-axis moving mechanism 51 to move the micro camera 33 by the calculated distance in the X-axis directions.

Figure 4:
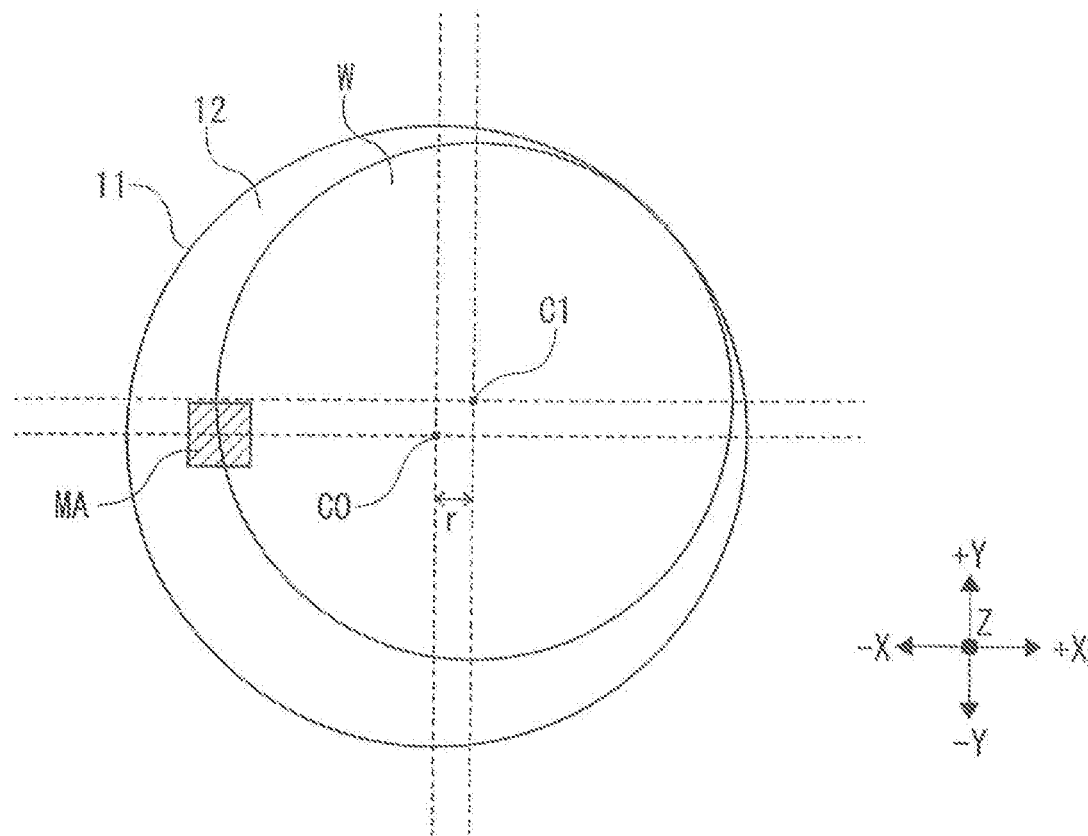
FIG. 4 is a plan view illustrating an image capturing range of a micro camera disposed over an outer circumference of a wafer.

In this manner, as illustrated in FIG. 4, the image capturing range of the micro camera 33, denoted by MA, is placed over the outer circumference of the wafer W. The control unit 61 controls the micro camera 33 to capture an image of the outer circumference of the wafer W and inspects the state of the outer circumference of the wafer W on the basis of the captured image.

According to the present embodiment, as described above, the distance calculating section 63 of the control unit 61 calculates the center-to-center distance r in the X-axis directions depending on the rotational angle of the rotating holding table 11. Then, the control unit 61 places the micro camera 33 in an appropriate image capturing position therefor for capturing an image of the outer circumference of the wafer W on the basis of the calculated center-to-center distance r and the distance in the X-axis directions between the center C0 of the holding surface 12 and the center of the image capturing range of the micro camera 33.

According to the present embodiment, in the case where the holding surface center coordinates and the wafer center coordinates are displaced out of alignment with each other, allowing the position in the X-axis directions of the outer circumference of the wafer W to vary as the holding table 11 rotates, the control unit 61 can make the image capturing range of the micro camera 33 follow the varying position in the X-axis directions of the outer circumference of the wafer W.

According to the present embodiment, consequently, even in the case where the holding surface center coordinates and the wafer center coordinates are displaced out of alignment with each other, it is easy for the micro camera 33 to capture an image of the outer circumference of the wafer W.

In addition, simply when the macro camera 31 and the micro camera 33 are moved along the X-axis directions by the single X-axis moving mechanism 51, images of the surface of the wafer W can be captured and the surface of the wafer W can be inspected, and an image of the outer circumference of the wafer W can be captured and the outer circumference of the wafer W can be inspected.

According to the present embodiment, the wafer inspecting apparatus 1 captures images of the ground surface of the wafer W that has been ground and the outer circumference of the wafer W, and inspects the ground surface and the outer circumference of the wafer W on the basis of the captured images. However, the present invention is not limited to such details. The wafer inspecting apparatus 1 can also capture images of the polished surface of the wafer W that has been polished and the outer circumference of the wafer W, and inspects the polished surface and the outer circumference of the wafer W on the basis of the captured images.

Furthermore, the wafer inspecting apparatus 1 may be incorporated in a grinding apparatus or a polishing apparatus, and may capture images of a wafer W that has been ground or polished and inspect the wafer W on the basis of the captured images. In such a case, the grinding apparatus or the polishing apparatus may have a plurality of cassettes for housing processed wafers W, and the cassettes for housing the processed wafers W may be classified into different groups depending on the result of inspection by the wafer inspecting apparatus 1.

Alternatively, the wafer inspecting apparatus 1 may be incorporated in a cutting apparatus for cutting a wafer W. In such a case, the wafer inspecting apparatus 1 may be used for performing a kerf check on the wafer W that has been cut.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A wafer inspecting apparatus for capturing images of a surface and an outer circumference of a wafer and inspecting the surface and the outer circumference of the wafer on the basis of the captured images, comprising:
   a macro camera for capturing images of the surface of the wafer;
   a micro camera for capturing an image of the outer circumference of the wafer, the micro camera having a narrower image capturing range and a higher magnification ratio than the macro camera;
   a holding table having a holding surface for holding the wafer thereon;
   an electric motor for rotating the holding table about an axis at a center of the holding surface;
   an angle recognizer for recognizing a rotational angle of the holding table that is rotated by the electric motor;
   a support supporting the macro camera and the micro camera thereon;
   an X-axis moving mechanism for moving the support in X-axis directions parallel to the holding surface, wherein the X-axis moving mechanism comprises a housing with an opening therein extending in an x-axis direction and a built-in drive mechanism inside the housing to move the support, and wherein a portion of the support extends from the housing through the opening; and
   a control unit comprising a processor,
   wherein the processor is programmed to cause the macro camera to move to a position capable of capturing the image of the outer circumference of the wafer, recognizing coordinates of at least three points on the outer circumference of the wafer from the images captured by the macro camera, and calculating center coordinates of the wafer on the basis of the coordinates of the three points, and
   wherein the processor is programmed to acquire a relation between a center-to-center distance in the X-axis directions between center coordinates of the holding surface that are recognized beforehand and the center coordinates of the wafer calculated by the processor, and the rotational angle of the holding table, rotating the holding table, and calculating the center-to-center distance depending on the rotational angle of the holding table that is recognized by the angle recognizer, wherein
the processor controls the X-axis moving mechanism to move the micro camera along the X-axis directions on the basis of the distance in the X-axis directions between a center of the image capturing range of the micro camera and the center of the holding surface, and the center-to-center distance calculated by the processor and to place the micro camera in an image capturing position in the X-axis directions for placing the image capturing range of the micro camera over the outer circumference of the wafer, and
the processor controls the micro camera to capture the image of the outer circumference of the wafer and inspect a state of the outer circumference of the wafer on the basis of the captured image.

* * * * *